United States Patent
Liu et al.

(10) Patent No.: US 6,930,515 B2
(45) Date of Patent: Aug. 16, 2005

(54) LEVEL SHIFTING AND LEVEL SHIFTING AMPLIFIER CIRCUITS

(75) Inventors: Liusheng Liu, San Jose, CA (US); Guoxing Li, Sunnyvale, CA (US)

(73) Assignee: O2 Micro International Limited, Grand Cayman (KY)

(*) Notice: Subject to any disclaimer, the term of this patent is extended or adjusted under 35 U.S.C. 154(b) by 0 days.

(21) Appl. No.: 10/933,110

(22) Filed: Sep. 2, 2004

(65) Prior Publication Data

US 2005/0024087 A1 Feb. 3, 2005

Related U.S. Application Data

(63) Continuation of application No. 10/200,006, filed on Jul. 19, 2002.

(51) Int. Cl.[7] .......................................... H03K 19/0175
(52) U.S. Cl. .............................. 326/80; 326/63; 326/33; 327/77; 330/69
(58) Field of Search ............................... 326/63–64, 68, 326/80, 33, 86–87; 327/74–75, 77, 108–109, 80

(56) References Cited

U.S. PATENT DOCUMENTS

| 4,851,987 A | 7/1989 | Day ............................ 713/601 |
| 4,968,987 A | 11/1990 | Naka et al. ................. 341/143 |

(Continued)

FOREIGN PATENT DOCUMENTS

| EP | 0945778 A2 | 9/1999 | ............ G06F/1/32 |
| EP | 0 999 549 A2 | 5/2000 | ............ G11B/20/10 |
| JP | 09-101848 | 4/1997 | ............ G06F/1/32 |
| WO | WO 96/38841 | 12/1996 | ............ G11B/19/02 |

Primary Examiner—James H. Cho
(74) Attorney, Agent, or Firm—Grossman, Tucker, Perreault & Pfleger, PLLC

(57) ABSTRACT

Level shifting and amplified level shifting circuit topologies are provided that include two or more level shifting or amplified level shifting circuits. The level shifting circuits receive a variable and fixed input and generate a variable and fixed output that are level shifted with respect to the input signals. The amplified level shifting circuits receive a variable and fixed input and generate a variable and fixed output that are level shifted and amplified with respect to the input signals. These circuits may be utilized to form a detection circuit that detects a difference in the output signals.

17 Claims, 7 Drawing Sheets

U.S. PATENT DOCUMENTS

| | | | |
|---|---|---|---|
| 4,999,634 A | 3/1991 | Brazdrum et al. | 341/172 |
| 5,099,151 A | 3/1992 | Watanabe | 307/475 |
| 5,142,684 A | 8/1992 | Perry et al. | 713/320 |
| 5,167,024 A | 11/1992 | Smith et al. | 713/322 |
| 5,200,913 A | 4/1993 | Hawkins et al. | 361/681 |
| 5,218,704 A | 6/1993 | Watts, Jr. et al. | 713/322 |
| RE34,769 E * | 11/1994 | Yoshimoto et al. | 250/201.5 |
| 5,375,076 A | 12/1994 | Goodrich et al. | 361/681 |
| 5,511,203 A | 4/1996 | Wisor et al. | 713/322 |
| 5,548,777 A | 8/1996 | Woo | 710/1 |
| 5,560,024 A | 9/1996 | Harper et al. | 713/322 |
| 5,600,800 A | 2/1997 | Kikinis et al. | 710/303 |
| 5,619,402 A | 4/1997 | Liu | 363/20 |
| 5,642,417 A | 6/1997 | Stringer | 717/174 |
| 5,671,368 A | 9/1997 | Chan et al. | 710/301 |
| 5,692,197 A | 11/1997 | Narad et al. | 713/323 |
| 5,696,975 A | 12/1997 | Moore et al. | 717/168 |
| 5,699,244 A | 12/1997 | Clark, Jr. et al. | 702/2 |
| 5,708,840 A | 1/1998 | Kikinis et al. | 708/105 |
| 5,732,266 A | 3/1998 | Moore et al. | 713/1 |
| 5,790,875 A | 8/1998 | Andersin et al. | 713/320 |
| 5,796,705 A | 8/1998 | Kim | 710/62 |
| 5,797,089 A | 8/1998 | Nguyen | 455/403 |
| 5,815,679 A | 9/1998 | Liu | 710/311 |
| 5,835,759 A | 11/1998 | Moore et al. | 713/1 |
| 5,838,983 A | 11/1998 | Atkinson | 713/322 |
| 5,870,355 A | 2/1999 | Fujihara | 369/30.26 |
| 5,903,764 A | 5/1999 | Shyr et al. | 710/300 |
| 5,910,933 A | 6/1999 | Moore | 369/2 |
| 5,969,529 A | 10/1999 | Eiraku et al. | 324/433 |
| 5,974,549 A | 10/1999 | Golan | 713/200 |
| 5,983,073 A | 11/1999 | Ditzik | 455/11.1 |
| 6,006,285 A | 12/1999 | Jacobs et al. | 710/14 |
| 6,006,337 A | 12/1999 | Koo | 713/324 |
| 6,018,724 A | 1/2000 | Arent | 705/44 |
| 6,034,621 A | 3/2000 | Kaufman | 340/825.44 |
| 6,038,672 A | 3/2000 | Klein | 713/322 |
| 6,047,380 A | 4/2000 | Nolan et al. | 713/324 |
| 6,076,133 A | 6/2000 | Brainard et al. | 710/260 |
| 6,088,730 A | 7/2000 | Kato et al. | 709/227 |
| 6,088,809 A | 7/2000 | Atkinson | 713/324 |
| 6,101,562 A | 8/2000 | Chang et al. | 710/73 |
| 6,125,417 A | 9/2000 | Bailis et al. | 710/103 |
| 6,141,052 A | 10/2000 | Fukumitsu et al. | 348/373 |
| 6,151,012 A | 11/2000 | Bullister | 345/168 |
| 6,154,359 A | 11/2000 | Kamikakai et al. | 361/681 |
| 6,173,417 B1 | 1/2001 | Merrill | 714/15 |
| 6,195,713 B1 | 2/2001 | Chaiken et al. | 710/19 |
| 6,202,121 B1 | 3/2001 | Walsh et al. | 711/100 |
| 6,226,237 B1 | 5/2001 | Chan et al. | 369/33 |
| 6,233,464 B1 | 5/2001 | Chmaytelli | 455/556 |
| 6,259,597 B1 | 7/2001 | Anzai et al. | 361/683 |
| 6,266,714 B1 | 7/2001 | Jacobs et al. | 710/14 |
| 6,272,575 B1 | 8/2001 | Rajchel | 710/102 |
| 6,292,440 B1 | 9/2001 | Lee | 369/7 |
| 6,304,261 B1 | 10/2001 | Shields et al. | 345/358 |
| 6,310,634 B1 | 10/2001 | Bodnar et al. | 345/854 |
| 6,334,149 B1 | 12/2001 | Davis, Jr. et al. | 709/219 |
| 6,336,142 B1 | 1/2002 | Kato et al. | 709/227 |
| 6,349,386 B1 | 2/2002 | Chan | 713/323 |
| 6,356,905 B1 | 3/2002 | Gershman et al. | 707/10 |
| 6,378,077 B1 | 4/2002 | Atkinson | 713/324 |
| 6,385,734 B2 | 5/2002 | Atkinson | 713/324 |
| 6,393,499 B1 | 5/2002 | Chaiken et al. | 710/19 |
| 6,396,430 B1 | 5/2002 | Li | 341/155 |
| 6,437,628 B1 | 8/2002 | Davenport et al. | 327/333 |
| 6,535,017 B1 * | 3/2003 | Fulkerson | 326/66 |
| 6,720,826 B2 * | 4/2004 | Yoon | 330/69 |
| 2001/0028562 A1 | 10/2001 | Naghi | 362/85 |

\* cited by examiner

LEVEL SHIFTING AND LEVEL SHIFTING AMPLIFIER CIRCUITS

CROSS REFERENCE TO RELATED APPLICATIONS

This application is a continuation of U.S. Nonprovisional application Ser. No. 10/200,006 filed Jul. 19, 2002, the teachings of which are herein incorporated by reference.

FIELD OF THE INVENTION

The present invention relates to level shifting and/or amplifying level shifting circuitry. Particular utility for the present invention includes a detector circuit that can be used as a wakeup circuit to generate a wakeup signal that may be used in power management systems; although the present invention is broadly applicable to a level shifting and/or level shifting and amplifying circuit topologies that may be implemented in a broad range of applications.

DESCRIPTION OF RELATED ART

FIG. 1 depicts a generalized block diagram for a bipolar signal detector 10 known in the art. The detector includes a first comparator 12 that compares a sensing signal $V_{sen}$ with a positive threshold voltage $V_H$, and a second comparator 14 that compares the sensing signal $V_{sen}$ with a negative threshold signal $V_L$. The sensing signal $V_{sen}$ can be derived from an associated system (not shown), for example, a sense resistor. Gate 16 generates an output signal $V_{det}$ based on the outputs of one or both of the comparators. As shown by the polarity of the comparators, if $V_{sen}$ is less than $V_L$ or greater than $V_H$, then $V_{det}$ is HIGH (or LOW) indicating that $V_{sen}$ is greater than (absolute value) the threshold voltages. One disadvantage of this topology is that a negative power supply is required for the comparators and for the negative threshold voltage $V_L$. Also, if the sensing signal is small compared to the comparator offset, the comparator offset may generate erroneous outputs. In other words, if the difference between $V_H$ and $V_L$ is within the offset of the comparator, the circuit 10 becomes incapable of detecting a small sensed signal within this range.

SUMMARY OF THE INVENTION

In one aspect, the present invention provides a level shifting circuit topology. One exemplary topology includes a first and second level shifting circuits wherein said second level shifting circuit generating a level shifted output signal from a variable input signal, the said first level shifting circuit generating a fixed level shifted output threshold signal from a fixed input reference signal. The level shifting circuits are biased with respect to each other so that each has an output signal that is shifted with respect to the other.

Another exemplary level shifting circuit is provided that includes a first, second and third level shifting. The second level shifting circuit generates a level shifted output signal from a variable input signal. The first and third level shifting circuits generate fixed, level shifted output threshold signals from a fixed input reference signal. The level shifting circuits are biased with respect to each other so that each has an output signal that is shifted with respect to the other.

In another aspect, the present invention provides an amplifying level shifting circuit topology. One exemplary topology includes a first and second amplifying level shifting circuits. The second amplifying level shifting circuit generates an amplified and level shifted output signal from a variable input signal. The first amplifying level shifting circuit generates a fixed, amplified and level shifted output threshold signal from a fixed input reference signal. The amplified level shifting circuits are biased with respect to each other so that each has an output signal that is shifted with respect to the other.

Another exemplary amplifying level shifting circuit topology is provided that includes comprising a first, second and third amplifying level shifting circuits. The second amplifying level shifting circuit generates an amplified and level shifted output signal from a variable input signal. The first and third amplifying level shifting circuits generate fixed, amplified and level shifted output threshold signals from a fixed input reference signal. The amplified level shifting circuits are biased with respect to each other so that each has an output signal that is shifted with respect to the other.

In a specific, exemplary circuit implementation, the present invention provides a detection circuit that includes a first and second level shifting circuits and a comparator. The second level shifting circuit generates a level shifted output signal from a variable input signal, and the first level shifting circuit generates a fixed level shifted output threshold signal from a fixed input reference signal. The comparator receives the level shifted output signal and the fixed level shifted output signal and generates a signal indicative of the difference between the level shifted output signal and the fixed level shifted output signal.

In another specific, exemplary circuit implementation, the present invention provides a detection circuit that includes a first and second amplifying level shifting circuits and a comparator. The second amplifying level shifting circuit generates an amplified and level shifted output signal from a variable input signal, and the first amplifying level shifting circuit generating a fixed, amplified and level shifted output threshold signal from a fixed input reference signal. The comparator receives the amplified level shifted output signal and the fixed, amplified level shifted output signal and generating a signal indicative of the difference between the amplified level shifted output signal and the fixed, amplified level shifted output signal.

It will be appreciated by those skilled in the art that although the following Detailed Description will proceed with reference being made to preferred embodiments and methods of use, the present invention is not intended to be limited to these preferred embodiments and methods of use. Rather, the present invention is of broad scope and is intended to be limited as only set forth in the accompanying claims.

Other features and advantages of the present invention will become apparent as the following Detailed Description proceeds, and upon reference to the Drawings, wherein like numerals depict like parts, and wherein:

DETAILED DESCRIPTION OF EXEMPLARY EMBODIMENTS

Level Shifting Circuit Topologies

Figure 1:
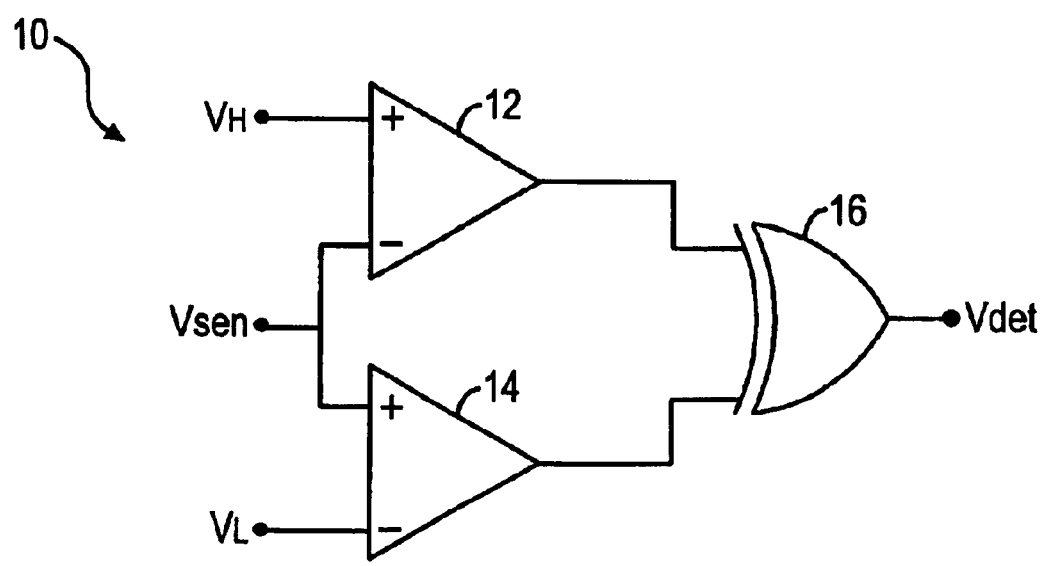
FIG. 1 depicts a generalized block diagram for a conventional bipolar signal detector.
Figure 2A:
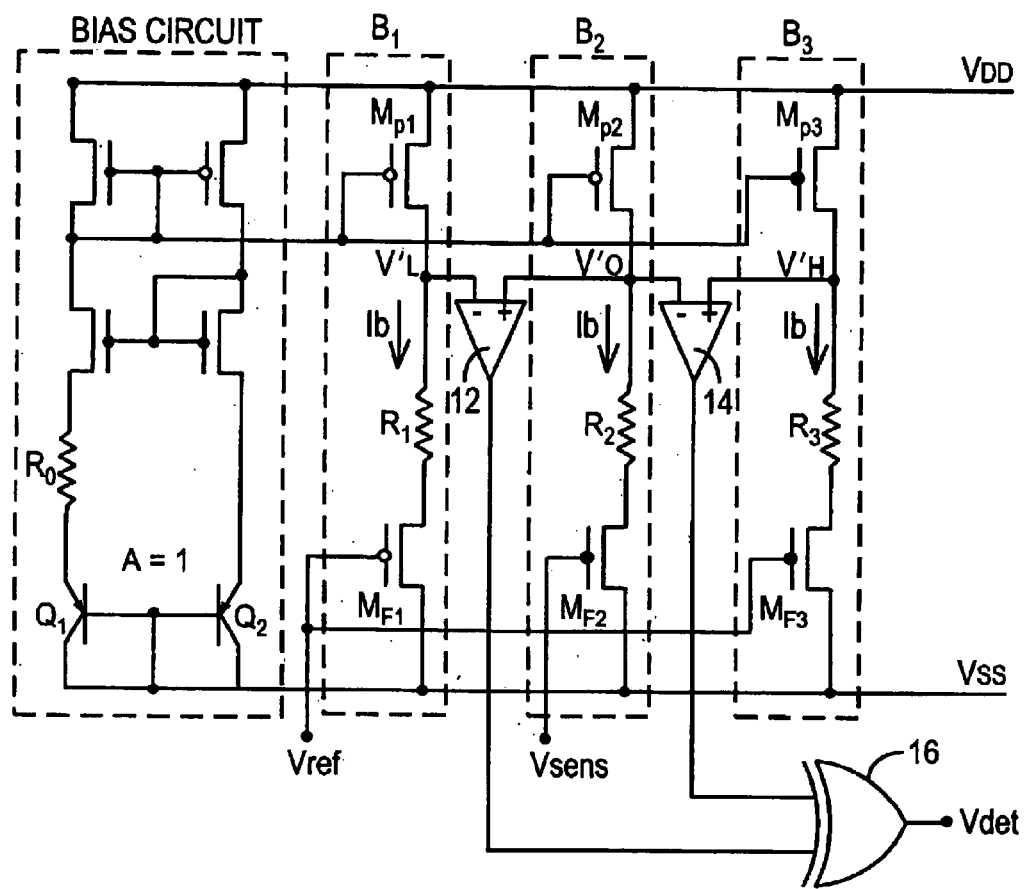
FIG. 2A depicts one exemplary circuit diagram of a level shifting circuit topology according to the present invention.

FIG. 2A depicts one exemplary circuit diagram of a level shifting circuit topology according to the present invention. The following description of this topology is directed to a level shifting the input signals when $V_{sen}$ is close to power supply VSS. As opposed to the topology of FIG. 1, the present invention provides two or more level shifting circuits, and in the exemplary embodiment three level shifting circuits $B_1$, $B_2$ and $B_3$ are provided, as described below.

Figure 2B:
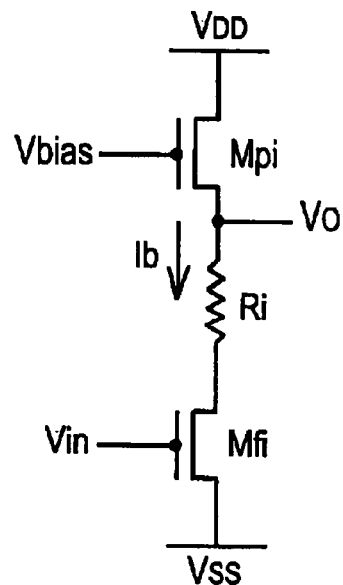
FIG. 2B depicts an exemplary individual level shifting circuit as used in the topology of FIG. 2A.

Referring briefly to FIG. 2B, which is a separate schematic for level shifter $B_1 \sim B_3$ in FIG. 2A. Each level shifter consists of an active load transistor $M_{Pi}$ (i=1, 2, 3), a resistor $R_i$(i=1, 2, 3) and a source follower $M_{Fi}$(i=1, 2, 3). The input signal $V_{in}$ goes into the gate of source follower $M_{Fi}$ and output from its source, then go through the resistor $R_i$, form the final output signal $V_o$.

Using small signal model analysis, we get:

$$V_o=[g_{mFi}/(g_{dsFi}+g_{mFi}+g_{mbFi})]V_{in}+I_b\{[(R_i+1/(g_{dsFi}+g_{mFi}+g_{mbFi})]/1/g_{dsPi}\} \quad (1)$$

Normally, $g_{mFi} \gg g_{mbFi} \gg g_{dsFi}$, $(R_i+1(g_{dsFi}+g_{mFi}+g_{mbFi})) \ll 1/g_{dsPi}$ So, equation (1) can be simplified as:

$$V_o \approx V_{in}+I_b R_i+I_b(1/g_{mFi}) (i=1,2,3) \quad (2)$$

From equation (2), the level shifter has a gain approximately equal to one, i.e., the level shifter has little or no amplification function. But the level shifter does have a shifting aspect represented by $I_b (R_i+1/g_{mFi})$. Thus, as will be apparent to one skilled in the art, by selecting values of $R_i$ and $g_{mFi}$ one can select a desired shifting value. Shifting, in this case, refers to amplitude shifting. In the circuit of FIG. 2A, and assuming that $V_{sen}$ is a signal that is close to a supply voltage VSS, it may be desirable to shift the input signals ($V_{ref}$ and $V_{sen}$, more fully described below) toward VDD. Although not a requirement of the present invention, shifting the amplitude of the input signals in this manner may be useful so that external circuitry (e.g., the comparators 12 and 14) operates in the linear region of operation for those devices.

In the exemplary embodiment of FIG. 2A, to simplify the analysis and construction, the three level shifters $B_1$, $B_2$ and $B_3$ have approximately the same dimension load transistor $M_{P1}$, $M_{P2}$ and $M_{P3}$. Also, the level shifters have approximately the same dimension source follower $M_{F1}$, $M_{F2}$ and $M_{F3}$. Of course, the term approximately is to be construed broadly, and may depend on the particular tolerance required or the particular operating environment. Additionally, it is not a requirement of the present invention to have approximately the same load dimension for the transistors, but rather, is described herein as only one exemplary construction.

Shifting the input signals is therefore a function of the resistors $R_1$, $R_2$, and $R_3$ as shown in equation (2). In this exemplary embodiment, the resistor $R_2$ associated with the sensed input signal $V_{sen}$ may be chosen to be shifted so that it resides between two threshold signals, i.e., $R_1<R_2<R_3$. So according to equation (2), each level shifter has a different shifting value.

Figure 2C:
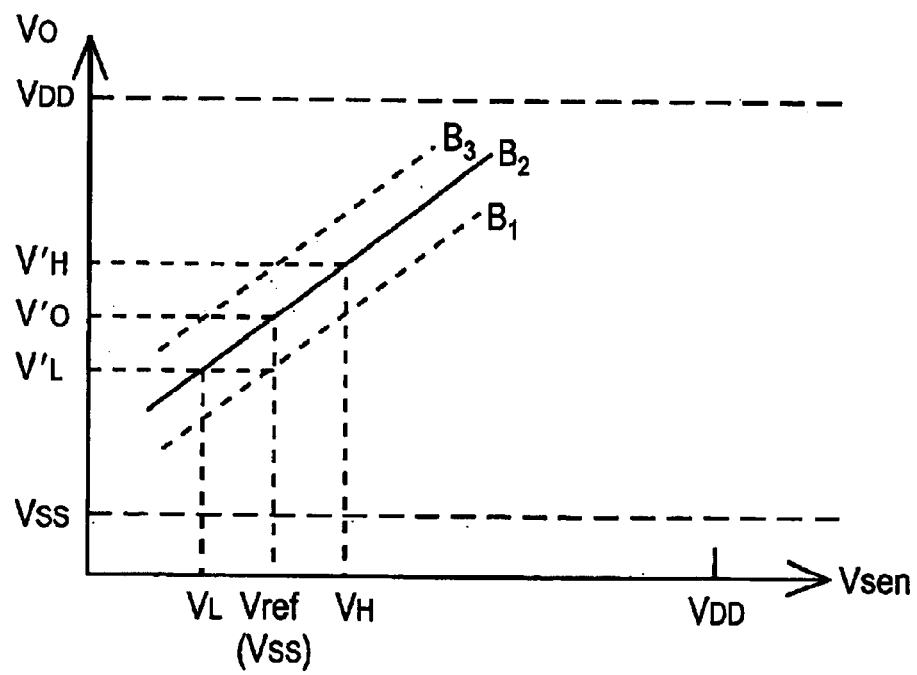
FIG. 2C depicts a graph of the DC transfer curves of the topology of FIG. 2A.

As shown in FIG. 2C, because the gain is roughly equal one, the DC transfer curves are three parallel 45 degree straight line for each level shifter $B_1$, $B_2$ and $B_3$. The DC transfer curves represent the input/output of each of the three level shifting circuits. Level shifter $B_2$ will shift the signal to be detected $V_{sen}$ to $V_o'$, which may be optimized to around the middle of the power supply, e.g., (VDD−VSS)/2. Level shifter $B_1$ generates a lower threshold $V_L'$, and the input to $B_1$ is a reference signal $V_{ref}$. Level shifter $B_3$ generates an upper threshold $V_H'$ from the reference signal $V_{ref}$. Thus, level shifters $B_1$ and $B_3$ generate a fixed, level shifted output from a fixed input, where the output is level shifted according to equation (2).

As mentioned above, the exemplary topology of FIG. 2A assumes that $V_{sen}$ is close to or equal to the power supply VSS. "Close to" is to be construed broadly and may depend on, for example, the tolerances required for a given application. For example, "close to" may be defined as within 10% of a power supply voltage. Accordingly, $V_{ref}$ is selected to be close to or equal to VSS.

For equation (2), the threshold $$|V_H'-V_o'|=I_b(R_3-R_2) \quad (3a)$$

$$|V_o'-V_L'|=I_b(R_2=R_1) \quad (3b)$$

Because the gain of the level shifter is roughly one, the original threshold $$|V_H-V_{ref}|=|V_H'-V_o'|=I_b (R_3-R_2) \quad (4a)$$

$$|V_{ref}-V_L|=|V_o'-V_L'|=I_b (R_2-R_1) \quad (4b)$$

As we can see from FIG. 2C, when the signal to be detected $V_{sen}$ is between $V_L$ and $V_H$ then the shifted signal $V_o'$ will be between $V_L'$ and $V_H'$, otherwise $V_o'$ will be greater than $V_H'$ or less than $V_L'$. When the topology of FIG. 2A is used as a detection circuit (as described with reference to FIG. 1) using comparators 12 and 14 and XOR gate 16, then when $V_{sen}$ is between $V_L$ and $V_H$, $V_{det}$ will keep the same state, either high or low. But when $V_{sen}<V_L$ or $V_{sen}>V_H$, then $V_o'<V_L'$ or $V_o'>V_H'$ and $V_{det}$ will change state, either from high to low or from low to high.

In FIG. 2A, the bias circuit generates the bias current $I_b$.

$$I_b=Vt\ln(A)/R_o \quad (5)$$

Where A is the area ratio of transistor $Q_1$, and $Q_2$. Substrate (5) into (4), $$|V_H-V_{ref}|=Vt\ln (A) (R_3-R_2)/R_o \quad (6a)$$

$$|V_{ref}-V_L|=Vt\ln (A) (R_2-R_1)/R_o \quad (6b)$$

From (6a) and (6b), the threshold is determined by transistor area ratio and resistor ratio and resistor differences, which can be accurately controlled in IC process. Of course, for those skilled in the art, the bias circuit is not necessarily the same as in FIG. 2A. Other kinds of circuits can be used to generate the bias current $I_b$.

Also, depending on the desired application, it may not be necessary to have both the lower threshold $V_L$ and upper threshold $V_H$. Instead, it may be desirable that only one threshold, either $V_L$ or $V_H$ is needed, in this case, one level shifter and one comparator, either level shifter $B_1$ and comparator 12 or level shifter $B_3$ and comparator 14 can be omitted.

Figure 3:
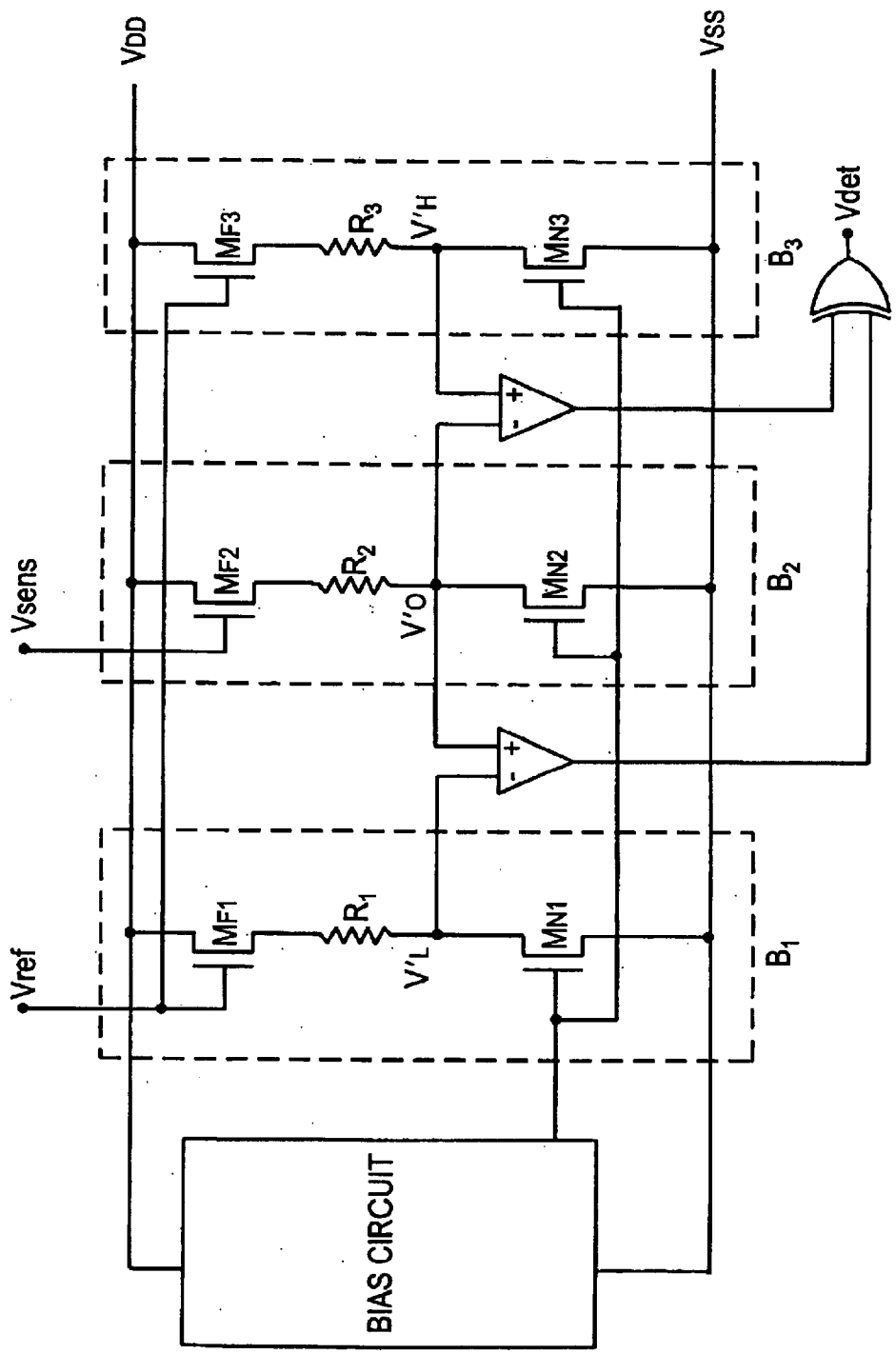
FIG. 3 depicts another exemplary circuit diagram of a level shifting circuit topology according to the present invention.

FIG. 3 is another exemplary level shifting topology of the present invention, and may be used, for example, when $V_{sen}$ is very close to power supply VDD. For those skilled in the art, this exemplary embodiment follows the same principles as described above with reference to FIGS. 2A, 2B and 2C. The changes are the source followers $M_{F1}$~$M_{F3}$ change from PMOS to NMOS, and the active load change from PMOS $M_{P1}$~$M_{P3}$ to NMOS $M_{N1}$~$M_{N3}$. The operation of FIG. 3 is similar to FIG. 2A except that the outputs of the level shifting circuits are shifted away from VDD and towards VSS. Of course, the circuits of FIGS. 2A and 3 are equally applicable for bipolar signal level shifting, i.e., where $V_{sen}$ resides at +/−0 Volts. In such a case, it may be desirable to down shift (FIG. 3) or up shift (FIG. 2A) the outputs so that the output reference signals $V_H'$ and $V_L'$ are both positive or both negative. These and other modifications may all be obtained using the topology of FIGS. 2A and/or 3.

As previously stated, the exemplary embodiments of FIG. 2A and FIG. 3 may be adapted to shift the signal to be detected, $V_{sen}$, to be around the middle of the power supply. If the topologies of FIG. 2A and/or FIG. 3 are adapted to include comparators 12 and 14, by shifting to around the middle of the power supply region allows the comparators to work in their linear region.

But if the signal to be detected, $V_{sen}$ is small, e.g. the threshold $|V_H - V_{sen}|$ or $|V_{sen} - V_L|$ is comparable to the offset of comparator 12 and/or 14, then it may be desirable to amplify the level shifted signals. Amplified level shifting circuits are described below.

Amplified Level Shifting Circuit Topologies

Figure 4A:
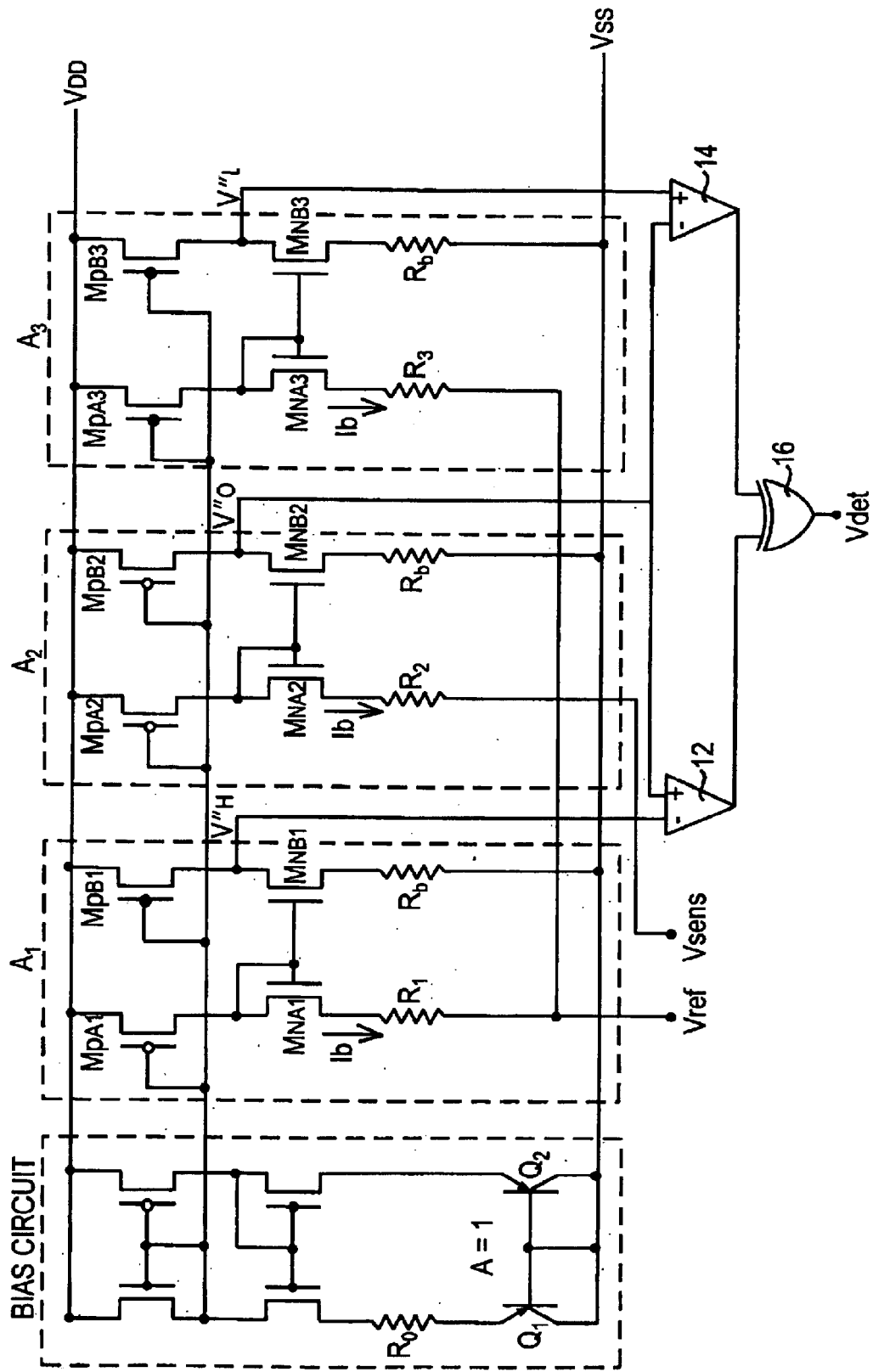
FIG. 4A depicts an exemplary circuit diagram of a level-shifting and amplifying circuit topology according to the present invention.

FIG. 4A is an exemplary amplified level shifting circuit topology. Like previous exemplary embodiments, the circuit of FIG. 4A assumes $V_{sen}$ is close to or equal to VSS. In this exemplary embodiment, three pre-amplifier stages $A_1$, $A_2$ and $A_3$ are used to both amplify and level shift input signals, as will be detailed below.

Figure 4B:
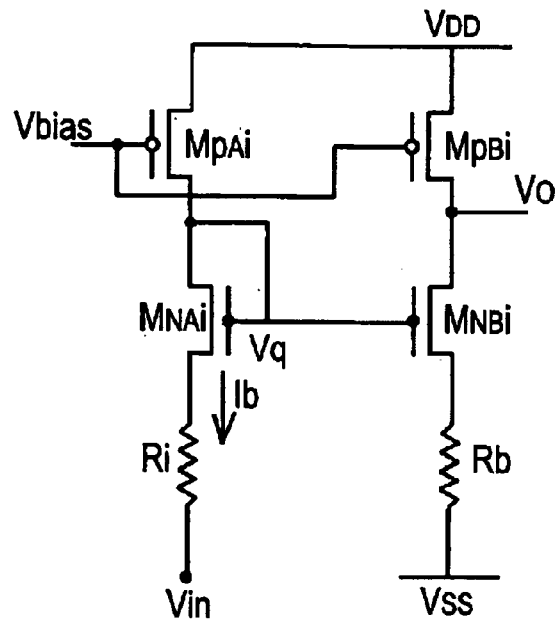
FIG. 4B depicts an exemplary individual level-shifting and amplifier circuit as used in the topology of FIG. 4A.

FIG. 4B is the schematic for pre-amplifier $A_1$~$A_3$ in FIG. 4A. Each pre-amplifier consists of two branches. $M_{PAi}$, $M_{NAi}$, and $R_i$(1=1, 2, 3) form the left branch, $M_{PBi}$, $M_{NBi}$ and $R_b$ form the right branch. The left branch shifts the input signal $V_{in}$, which is close to VSS, to an appropriate level $V_g$, $$V_g = V_{in} + I_b R_i + V_{gsNAi} \qquad (7)$$

Where $(I_b R_i + V_{gsNAi})$ is the shifted factor. In this exemplary embodiment, the right branch is a common source amplifier. Through small signal AC analysis, we get:

$$V_o = \{g_{mNBi}/[R_b g_{dsPBi}(g_{mNBi} + g_{mbNBi} + g_{dsNBi}) - (g_{dsNBi} + g_{dsPBi})]\} V_g$$

$$\approx \{g_{NBi}/[R_b g_{mNBi} g_{dsPBi} - (g_{dsNBi} + g_{dsPBi})]\} V_g \qquad (8)$$

$$\approx \beta V_g \qquad (9)$$

From (8), we see that the right branch has a gain β. Thus, one skilled in the art will recognize that by selecting an appropriate resistor $R_b$ value, the pre-amplifier will work in the linear region having a gain β. Thus, a small difference in input signal $V_g$, which is the shifted signal of $V_{in}$, will generate a larger difference in output $V_o$.

Figure 4C:
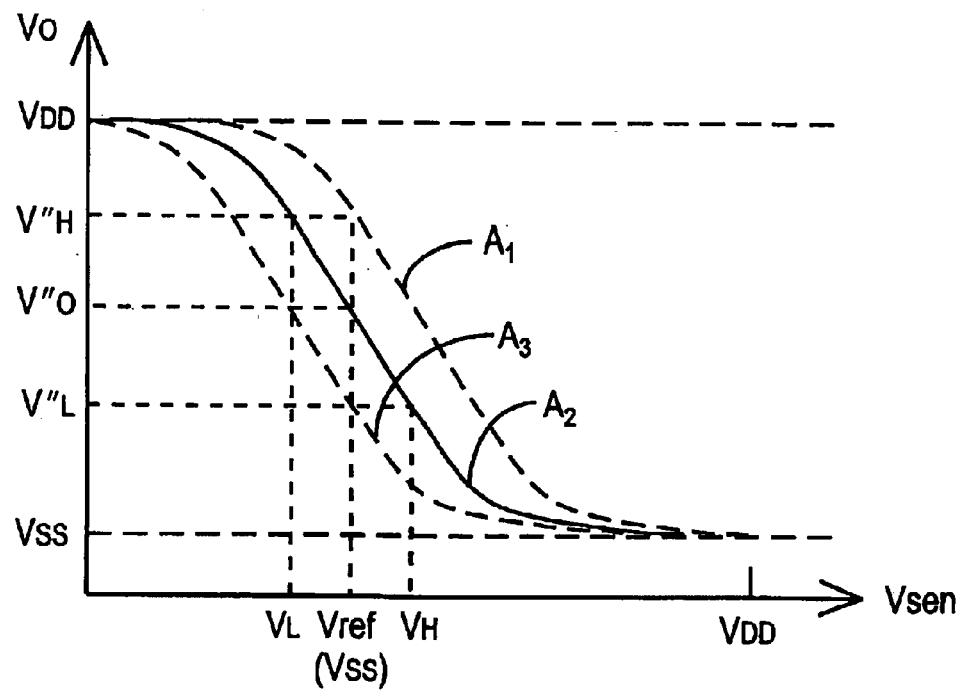
FIG. 4C depicts the DC transfer curves for the circuit of the topology of FIG. 4A.

Referring again to FIG. 4A, the three pre-amplifiers $A_1$, $A_2$, and $A_3$ have approximately the same dimension for all the relative transistors and approximately the same value for $R_b$, but, in order to shift the input signals a different value is selected for each of $R_1$, $R_2$ and $R_3$. To shift the signal to be detected $V_{sen}$ to a point between two threshold signals, then the values are selected as $R_1 < R_2 < R_3$. According to equation (7) and (8), each preamplifier circuit shifts the input signal and thus generates a different transfer curve, as shown in FIG. 4C.

Pre-amplifier $A_2$ shifts and amplifies the signal to be detected $V_{sen}$ to a desired output level $V_o"$. As before, this output value may be selected to be around the middle of the power supply. Pre-amplifier $A_1$ generates an upper threshold $V_H"$ from a fixed reference signal $V_{ref}$. Pre-amplifier $A_3$ is used to generate the lower threshold $V_L"$ from the reference signal $V_{ref}$. In the example of FIG. 4A, $V_{ref}$ is selected to be close to or equal to VSS.

According to equation (7), the original threshold $$|V_H - V_{ref}| = I_b(R_3 - R_2) \qquad (10a)$$

$$|V_{ref} - V_L| = I_b(R_2 - R_1) \qquad (10b)$$

But after the pre-amplifier, the original threshold will be amplified to $$|V_o" - V_L"| = \beta I_b(R_3 - R_2) \qquad (11a)$$

$$|V_H" - V_o"| = \beta I_b(R_2 - R_1) \qquad (11b)$$

As we can see from FIG. 4C, when the signal to be detected $V_{sen}$ is between $V_L$ and $V_H$ then the shifted and amplified signal $V_o"$ will be between $V_L"$ and $V_H"$, otherwise $V_o"$ will be greater than $V_H"$ or less than $V_L"$. When the topology of FIG. 4A is used as a detection circuit (as described with reference to FIG. 1) using comparators 12 and 14 and XOR gate 16, then when $V_{sen}$ is between $V_L$ and $V_H$, $V_{det}$ will keep the same state, either high or low. But when $V_{sen} < V_L$ or $V_{sen} > V_H$, then $V_o" < V_L"$ or $V_o" > V_H"$ and $V_{det}$ will change state, either from high to low or from low to high. So, even if the original threshold is only about 1 mV, which is comparable to the comparator offset, the gain can be adjusted such that the output signals are well larger than the comparator offset. For example, β may be selected to be equal to about 100, then the amplified threshold will be 100 mV, which is typically much larger than the offset of a typical comparator.

Again, the bias circuit in FIG. 4A will generate the bias current.

$$I_b = Vt \ln(A)/R_o$$

Then, the original threshold in (10a) and (10b) will be $$|V_H - V_{ref}| = Vt \ln(A) (R_3 - R_2)/R_o \qquad (12a)$$

$$|V_{ref} - V_L| = Vt \ln(A) (R_2 - R_1)/R_o \qquad (12b)$$

The threshold is determined by transistor area ratio and resistor ratio and resistor differences, which can be precisely controlled in IC Process. Of course, those skilled in the art will recognize that alternative bias circuits may be used to generate the bias current $I_b$. Also, depending on the desired application, it may not be necessary to have both the lower and upper threshold $V_L$ and $V_H$. In this case, one pre-amplifier and/or one comparator, either $A_1$ and comparator 12 or $A_3$ and comparator 14 can be omitted.

Figure 5:
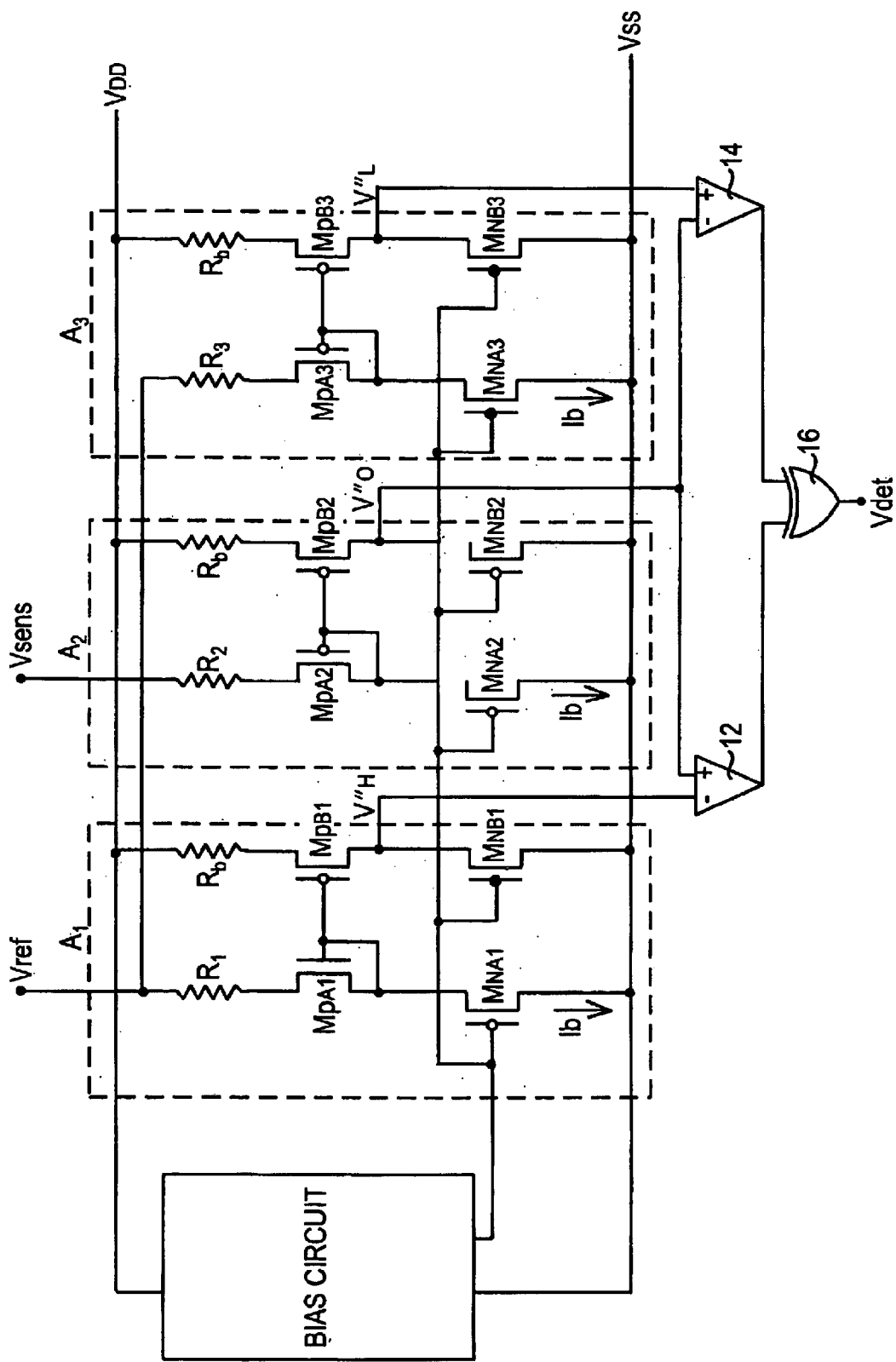
FIG. 5 depicts another exemplary circuit diagram of a level-shifting and amplifying circuit topology according to the present invention.

FIG. 5 is another exemplary amplified level shifting topology of the present invention, and may be used, for example, when $V_{sen}$ is very close to power supply VDD. For those skilled in the art, this exemplary embodiment follows the same principles as described above with reference to FIGS. 4A, 4B and 4C. The operation of FIG. 5 is similar to FIG. 4A except that the input signals are shifted away from VDD and towards VSS. Of course, the circuits of FIGS. 4A and 5 are equally applicable for bipolar signal level shifting, i.e., where $V_{sen}$ resides at +/−0 Volts. In such a case, it may be desirable to shift down (FIG. 5) or shift up (FIG. 4A) the outputs so that the output reference signals $V_H"$ and $V_L"$ are both positive or both negative. These and other modifications may all be obtained using the topology of FIGS. 4A and/or 5.

Note that if the input signal is a small signal, the topologies of FIG. 4A and 5 may be used as a detection circuit for "small signal" detection. Small signal may mean, for example, that the signal to be detected is within the tolerance range of given components. Note further that the amplifying function of this circuit topology may be chosen to make the output threshold to be larger than the offset voltage of a comparator (12 or 14). Those skilled in the art will recognize numerous modifications to the exemplary topologies of the present invention. For example, those skilled in the art will recognize that many different level shifting circuits exist which may be modified to be biased with respect to one another so that the outputs are shifted in a manner according to the present invention. Indeed, the specific circuit topologies disclosed herein are only exemplary, and other level shifting topologies may be used instead. Likewise, the exemplary level shifting and amplifying circuit topologies described herein may be replaced with other level shifting and amplifying circuit topologies as are known in the art, without departing from the present invention. All such modifications are deemed within the scope of the present invention, only as limited by the appended claims.

What is claimed is:

1. An amplified level shifting circuit topology comprising:
    a first amplifying level shifting circuit capable of at least amplifying a variable input signal by a first gain factor greater than unity to provide an amplified and level shifted output signal; and
    a second amplifying level shifting circuit capable of at least amplifying a fixed input reference signal by a second gain factor greater than unity to provide a fixed, amplified and level shifted output threshold signal, said amplified level shifting circuits being biased with respect to each other so that each has a DC transfer curve that is shifted with respect to the other.

2. The amplified level shifting circuit topology as claimed in claim 1, wherein said second amplifying level shifting circuit comprises:
    a first branch circuit for level shifting said fixed input signal, said first branch further comprising a load resistor for determining a shift of said fixed input signal; and,
    a second branch circuit for amplifying said fixed input signal by said second gain factor.

3. The amplified level shifting circuit topology as claimed in claim 2, further comprising a bias circuit generating a bias voltage for biasing said first and second branch.

4. The amplified level shifting circuit topology as claimed in claim 1, wherein DC transfer curves are right shifted with respect to a supply voltage.

5. The amplified level shifting circuit topology as claimed in claim 1, wherein DC transfer curves are left shifted with respect to a supply voltage.

6. The amplified level shifting circuit topology as claimed in claim 1, wherein said DC transfer curves are shifted to be approximately in a middle of two supply voltages.

7. The amplified level shifting circuit topology as claimed in claim 1, further comprising a third amplifying level shifting circuit capable of at least amplifying said fixed input reference signal by a third gain factor greater than unity to provide a second fixed, amplified and level shifted output threshold signal, said first, second, and third amplified level shifting circuits being biased with respect to each other so that each has a DC transfer curve that is shifted with respect to the other.

8. A detection circuit comprising:
    a first amplifying level shifting circuit capable of at least amplifying a variable input signal by a first gain factor greater than unity to provide an amplified and level shifted output signal;
    a second amplifying level shifting circuit capable of at least amplifying a fixed input reference signal by a second gain factor greater than unity to provide a fixed, amplified and level shifted output threshold signal, said amplified level shifting circuits being biased with respect to each other so that each has a DC transfer curve that is shifted with respect to the other; and
    a comparator capable of receiving said amplified and level shifted output signal and said fixed, amplified and level shifted output threshold signal and generating a signal indicative of a difference between said amplified and level shifted output signal and said fixed, amplified and level shifted output threshold signal.

9. The detection circuit as claimed in claim 8, wherein said second amplifying level shifting circuit comprises:
    a first branch circuit for level shifting said fixed input signal, said first branch further comprising a load resistor for determining a shift of said fixed input signal; and,
    a second branch circuit for amplifying said fixed input signal by said second gain factor.

10. The detection circuit as claimed in claim 9, further comprising a bias circuit generating a bias voltage for biasing said first and second branch.

11. The detection circuit as claimed in claim 8, further comprising a third amplifying level shifting circuit capable of at least amplifying said fixed input reference signal by a third gain factor greater than unity to provide a second fixed, amplified and level shifted output threshold signal, said first, second, and third amplified level shifting circuits being biased with respect to each other so that each has a DC transfer curve that is shifted with respect to the other.

12. A method comprising:
    amplifying a variable input signal by a first gain factor greater than unity, and shifting said variable input signal to provide an amplified and level shifted output signal from said variable input signal; and
    amplifying a fixed input reference signal by a second gain factor greater than unity, and shifting said fixed input reference signal to provide a fixed, amplified and level shifted output threshold signal from said fixed input reference signal, said fixed, amplified and level shifted output threshold signal being shifted with respect to said amplified and level shifted output signal.

13. The method of claim 12, further comprising comparing said amplified and level shifted output signal and said fixed, amplified and level shifted output threshold signal; and
    generating a signal representative of a difference between said amplified and level shifted output signal and said fixed, amplified and level shifted output threshold signal.

14. The method of claim 12, further comprising shifting said output signals up with respect to a supply voltage.

15. The method of claim 12, further comprising shifting said output signals down with respect to a supply voltage.

16. The method of claim 12, wherein said first and second gain factor are approximately equal.

17. The method of claim 12, further comprising amplifying said fixed input reference signal by a third gain factor greater than unity, and shifting said fixed input reference signal to provide a second fixed, amplified and level shifted output threshold signal from said fixed input reference signal, said second fixed, amplified and level shifted output threshold signal being shifted with respect to said amplified and level shifted output signal.

\* \* \* \* \*